(12) United States Patent
Liu et al.

(10) Patent No.: US 10,586,904 B2
(45) Date of Patent: Mar. 10, 2020

(54) LED HOLDER, LED DEVICE AND LED DISPLAY SCREEN

(71) Applicant: FOSHAN NATIONSTAR OPTOELECTRONICS CO., LTD., Foshan (CN)

(72) Inventors: Chuanbiao Liu, Foshan (CN); Lu Yang, Foshan (CN); Danwei Li, Foshan (CN); Feng Gu, Foshan (CN); Zhuang Peng, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 0 days.

(21) Appl. No.: 16/151,733

(22) Filed: Oct. 4, 2018

(65) Prior Publication Data
US 2019/0252584 A1   Aug. 15, 2019

(30) Foreign Application Priority Data

Feb. 9, 2018   (CN) .......................... 2018 1 0135307

(51) Int. Cl.
| | |
|---|---|
| H01L 33/62 | (2010.01) |
| H01L 33/54 | (2010.01) |
| H01L 33/60 | (2010.01) |
| H01L 33/48 | (2010.01) |
| H01L 25/13 | (2006.01) |
| G09F 9/33 | (2006.01) |

(52) U.S. Cl.
CPC .............. *H01L 33/62* (2013.01); *H01L 25/13* (2013.01); *H01L 33/486* (2013.01); *H01L 33/54* (2013.01); *H01L 33/60* (2013.01)

(58) Field of Classification Search
CPC ....... H01L 33/62; H01L 33/486; H01L 33/54; H01L 33/38; H01L 33/60
See application file for complete search history.

(56) References Cited

U.S. PATENT DOCUMENTS

| | | | |
|---|---|---|---|
| 2010/0096644 A1* | 4/2010 | Kong .................... | H01L 33/486 257/88 |
| 2014/0138715 A1* | 5/2014 | Zhang ................. | H01L 25/0753 257/88 |

FOREIGN PATENT DOCUMENTS

JP          5122062 B2 *  1/2013   ............. H01L 24/97

* cited by examiner

*Primary Examiner* — Marcos D. Pizarro
*Assistant Examiner* — Antonio B Crite
(74) *Attorney, Agent, or Firm* — Bond Schoeneck & King, PLLC; George McGuire

(57) ABSTRACT

Provided are an LED holder, an LED device and an LED display screen. The LED holder includes a metal frame and a cup cover wrapping the metal frame. The cup cover includes a reflective cup. The cup cover has a first lateral surface and a second lateral surface disposed opposite to each other. A height of the first lateral surface is greater than a height of the second lateral surface. The metal frame includes metal pins exposed outside the cup cover and disposed on the first lateral surface and/or the second lateral surface. The bottom of the cup cover is of a sloping structure, so that the light emitted by an LED chip in the reflective cup propagates along a specified direction.

10 Claims, 6 Drawing Sheets

LED HOLDER, LED DEVICE AND LED DISPLAY SCREEN

CROSS-REFERENCE TO RELATED APPLICATIONS

This application claims priority to a Chinese patent application No. 201810135307.0 filed on Feb. 9, 2018, the disclosure of which is incorporated herein by reference in its entirety.

TECHNICAL FIELD

The present disclosure relates to the technique field of LED and, in particular, to an LED holder, an LED device and an LED display screen.

BACKGROUND

Light Emitting Diode (LED) display screen, as a tool for posting information, can present various types of information, such as text, pattern, video, etc. Multiple LED devices are arranged on the LED display screen. Each of the multiple LED devices includes an LED holder, an LED chip and a sealant. The LED chip is fixed in a cavity of a reflective cup of the LED holder, and the cavity is filled with the sealant. At present, when installed outdoors, the LED screen is mostly installed at a high place, and people needs to hold his/her head up when viewing the LED screen. However, in the related LED devices, a light-emitting surface (that is, a normal plane of a direction in which the light intensity of the LED chip is maximum) of the LED chip and a plane where pins of the LED chip are welded are either parallel to each other (an included angle may be regarded as 0 degree), or perpendicular to each other (that is, the included angle is 90 degrees). The normal plane of the light-emitting surface is usually disposed horizontally. When people look up and watch the LED screen with an elevation angle, the light above the normal plane cannot be seen by the people, and the larger the elevation angle is, the darker the brightness sensed by the people is.

SUMMARY

Embodiments of the present disclosure provide an LED holder to solve the above technical problem.

In a first aspect, an LED holder provided by embodiments of the present disclosure includes a metal frame and a cup cover wrapping the metal frame. The cup cover includes a reflective cup, and a side of the cup cover facing away from a cup opening of the reflective cup is of a sloping structure. The cup cover has a first lateral surface and a second lateral surface disposed opposite to each other. A height of the first lateral surface is greater than a height of the second lateral surface. The metal frame includes metal pins exposed outside the cup cover, and the metal pins are disposed the first lateral surface and/or the second lateral surface.

The side of the cup cover facing away from the cup opening of the reflective cup is configured in a sloping structure. That is, the bottom of the cup cover is a sloping surface, so that the cup opening of the reflective cup can be in a sloping state after the LED holder is installed, and the light emitted by an LED chip in the reflective cup propagates along a specified direction. When the display screen including the LED holder is installed at a high outdoor place, the LED holder may slope downward to increase the perception brightness of the display screen. The metal pins are disposed on the first lateral surface and/or the second lateral surface which are different in height, facilitating the installation and fixation of the LED holder, reducing the installation difficulty, increasing the installation speed and enhancing the stability of the LED holder after the LED holder is installed.

In an exemplary embodiment, the side of the cup cover facing away from the cup opening of the reflective cup is the bottom of the cup cover. A first leading-out position where the metal pin is led out of the cup cover is disposed on the first lateral surface, and a vertical distance between the first leading-out position and the bottom of the cup cover is $h1$.

A second leading-out position where the metal pin is led out of the cup cover is disposed on the second lateral surface. A vertical distance between the second leading-out position and the bottom of the cup cover is $h2$.

$$h1 \geq h2, \text{or } h1 < h2.$$

In an exemplary embodiment, the metal frame includes four metal pins. The four metal pins are all disposed on the second lateral surface.

In an exemplary embodiment, the metal frame includes at least six metal pins, and the at least six metal pins are distributed on the first lateral surface and the second lateral surface.

In an exemplary embodiment, a support for increasing installation stability of the cup cover is disposed on the second lateral surface.

In an exemplary embodiment, the support is provided with a support surface. The support surface and the side of the cup cover facing away from the cup opening are at the same plane.

In an exemplary embodiment, the support is a triangle support plate.

In an exemplary embodiment, at least two supports are disposed at intervals on the second lateral surface, and at least one metal pin is disposed between adjacent two supports.

In a second aspect, an LED device is provided by an embodiment of the present disclosure. The LED device includes an LED holder, an LED chip and a sealant. The LED holder adopts the LED holder described in any one of above embodiments. The LED chip is fixed in a cavity of the reflective cup in the LED holder, and the cavity is filled with the sealant.

In a third aspect, an LED display screen is provided by an embodiment of the present disclosure. The LED display screen includes multiple LED devices and a PCB. The multiple LED devices are installed on the PCB. The LED device is the LED device described in possible embodiments in the second aspect.

BRIEF DESCRIPTION OF DRAWINGS

To illustrate technical solutions in embodiments of the present disclosure more clearly, the accompanying drawings used in description of the embodiments will be briefly described below. Apparently, the accompanying drawings described below are merely simplified schematic diagrams of some embodiments of the present disclosure, and those skilled in the art may obtain other accompanying drawings based on the accompanying drawings described below.

In the above drawings.

1: metal frame, 11: embedded part, 12: metal pin, 2: cup cover, 21: reflective cup, 211: cup opening, 22: first lateral surface, 23: second lateral surface, 3: support, 31: support surface, 4, LED chip.

DETAILED DESCRIPTION

Solutions in embodiments of the present disclosure will be described clearly and completely in conjunction with the accompanying drawings in the embodiments of the present disclosure. The embodiments described below are merely some of embodiments of the present disclosure, not all the embodiments. Based on the embodiments of the present disclosure, all other embodiments obtained by those skilled in the art without creative work are within the scope of the present disclosure.

In the description of embodiments of the present disclosure, unless otherwise expressly specified and limited, the terms "couple", "connect" or "fix" shall be understood in broad sense, and for example, may refer to fixed connection, detachable connection or integral connection, may refer to mechanical connection or electrical connection, may refer to direct connection, indirect connection through an intermediate medium, and may refer to communication in two elements or an interaction relationship between two elements. For those ordinary skilled in the art, specific meanings of the above terms in the embodiments of the present invention can be understood according to specific conditions.

In embodiments of the present disclosure, unless otherwise expressly specified and limited, when a first feature is described as "on" or "below" a second feature, the first feature and the second feature may be in direct contact, or another feature is between the first and second features. When the first feature is described as "on" or "above" or "over" the second feature, the first feature is right on or above the second feature, or the first feature is obliquely on or above the second feature, or the first feature is at a higher level than the second feature. When the first feature is described as "under" or "below" or "underneath" the second feature, the first feature is right under or below the second feature, or the first feature is obliquely under or below the second feature, or the first feature is at a lower level than the second feature.

Figure 1:
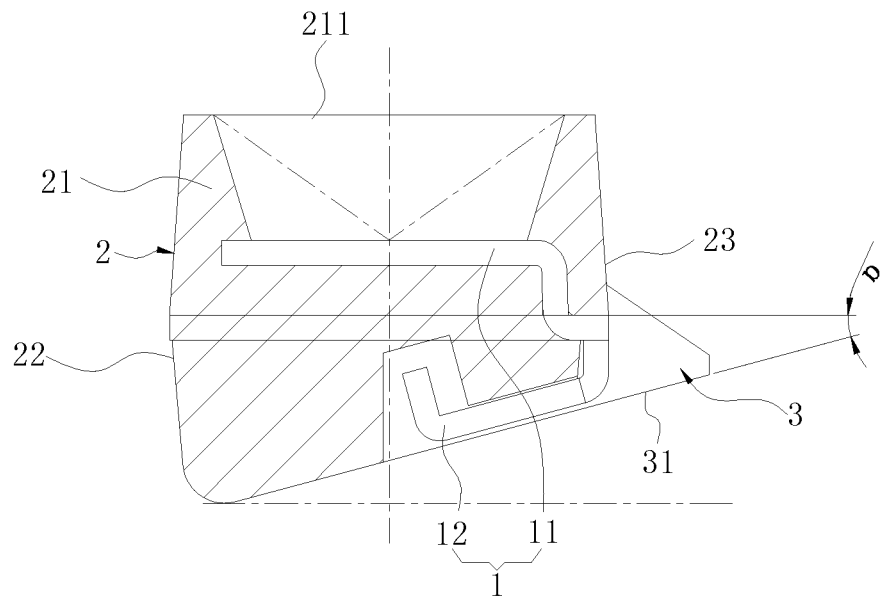
FIG. 1 is a structure diagram of an LED holder described in an embodiment of the present disclosure.
Figure 2:
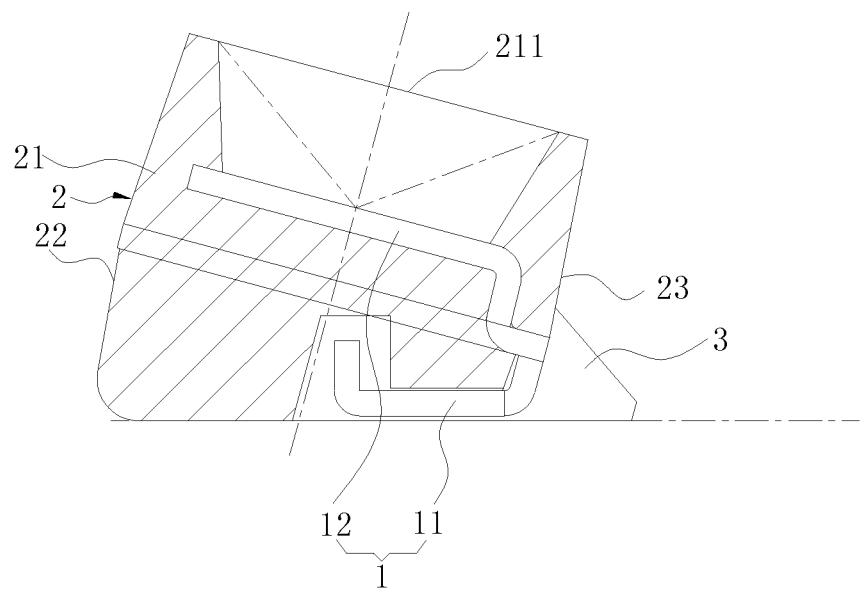
FIG. 2 is a schematic diagram illustrating an installation state of an LED holder described in an embodiment of the present disclosure.

FIG. 1 is structure diagram of an LED holder in an embodiment of the present disclosure. FIG. 2 is schematic diagram illustrating an installation state of an LED holder described in an embodiment of the present disclosure. Referring to FIG. 1 and FIG. 2, an LED holder provided by embodiments of the present disclosure includes a metal frame 1 and a cup cover 2 wrapping the metal frame 1. The metal frame 1 includes an embedded part 11 embedded in the cup cover 2 and one or more metal pins 12 exposed from the cup cover 2. The cup cover 2 includes a reflective cup 21 having a cavity. A side of the cup cover 2 facing away from a cup opening 211 of the reflective cup 21 is a bottom of the cup cover 2. The bottom of the cup cover 2 is in a sloping structure. That is, the bottom of the cup cover 2 is a sloping surface.

The side of the cup cover 2 facing away from the cup opening 211 of the reflective cup 21 is configured in a sloping structure. That is, the bottom of the cup cover 2 is a sloping surface, so that the cup opening 211 of the reflective cup 21 is in a sloping state after the LED holder is installed, thereby leading out the light emitted by an LED chip in the reflective cup 21 in a specified direction. When the display screen including the LED holder is installed at a high place, the LED holder may slope downward, thereby increasing the brightness of the display screen sensed by the user.

Additionally, the exposed metal pin 12 is led out from a lateral surface of the cup cover 2 and bent to the bottom of the cup cover 2. In order to increase the combination tightness of the metal pin 12 and the cup cover 2. A holding slot is recessed on the bottom of the cup cover 2, and an end of the metal pin 12 extends into the holding slot.

In this embodiment, the cup cover 2 is made from engineering resins and is integrally formed by injection molding, and the engineering resins may adopt any one of polyphthalamide (PPA), polymethyl methacrylate (PMMA), polyamide (PA), polycarbonate (PC), polyformaldehyde (POM) and polybutylene terephthalate (PBT). In an embodiment, the engineering resin is white polyphthalamide (PPA) which has a small light absorption and low cost.

In an embodiment, a light-absorbing layer may be disposed on a part of an external lateral surface of the reflective cup 21. The light-absorbing layer is configured to extend from the top of the external lateral surface of the reflective cup 21 to a position near the bottom of the external lateral surface of the reflective cup 21. That is, the external lateral surface of the reflective cup 21 is partly coated by the light-absorbing layer. In other embodiments, the light-absorbing layer may also be disposed on a top face of the reflective cup 21. The light-absorbing layer is a black ink layer or a black paint layer.

The cup opening 211 of the reflective cup 21 may be a square, a circle, an ellipse or an irregular shape. Additionally, the LED holder also has various variants. For example, a cross section of the cup cover 2 of the LED holder may be a square, a parallelogram, a hexagon or a regular triangle.

In this embodiment, as shown in FIG. 1, a section of the cup cover 2 is a quadrangle. An included angle between a plane where the bottom of the cup cover 2 is located and a plane where the top of the cup cover 2 is located is $\alpha$, $0°<\alpha<90°$. In an embodiment, $\alpha$ is 15°. The cup opening 211 of the reflective cup 21 and the top of the cup cover 2 is in a same plane.

The manufacturing process of the LED holder is as follows. A metal strip such as a copper sheet or an iron sheet is punched to form a pad shape, and then the surface thereof is plated with metal or alloy. After the punched metal strip is plated, PPA is formed on the metal strip (that is, the metal frame) by injection molding to produce the cup cover 2. After injection molding, the metal strip is bent around the cup cover 2 to form the metal pins 12.

In an embodiment of the present disclosure, as shown in FIGS. 1 and 2, the cup cover 2 has a first lateral surface 22 and a second lateral surface 23 disposed opposite to each other. A height of the first lateral surface 22 is greater than a height of the second lateral surface 23. The metal pin 12 is disposed on the second lateral surface 23.

The exposed metal pin 12 is disposed on the second lateral surface 23 which is at a lower position, so that the sealant only needs to cover the metal pin 12 on the lower lateral surface. Therefore, the thickness of the sealant is effectively reduced, the usage amount of the sealant is reduced, and the subsequent process of installing mask is smoothly performed.

In this embodiment, there are four metal pins 12 are exposed outside the cup cover 2. The four metal pins 12 are arranged at intervals, and an unoccupied space is between every two adjacent metal pins 12 which can facilitate a probe to perform a lateral surface test.

Additionally, to increase the stability of the inclined LED holder during installation, two supports 3 are disposed on the second lateral surface 23. The support 3 is a triangle support plate. An edge of the triangle support plate and the plane where the bottom of the cup cover 2 is located are at a same level. An edge adjacent to the edge that is in the same plane with the bottom of the cup cover 2 is connected to the second lateral surface 23. The four metal pins 12 are all disposed between the two supports 3.

Figure 3:
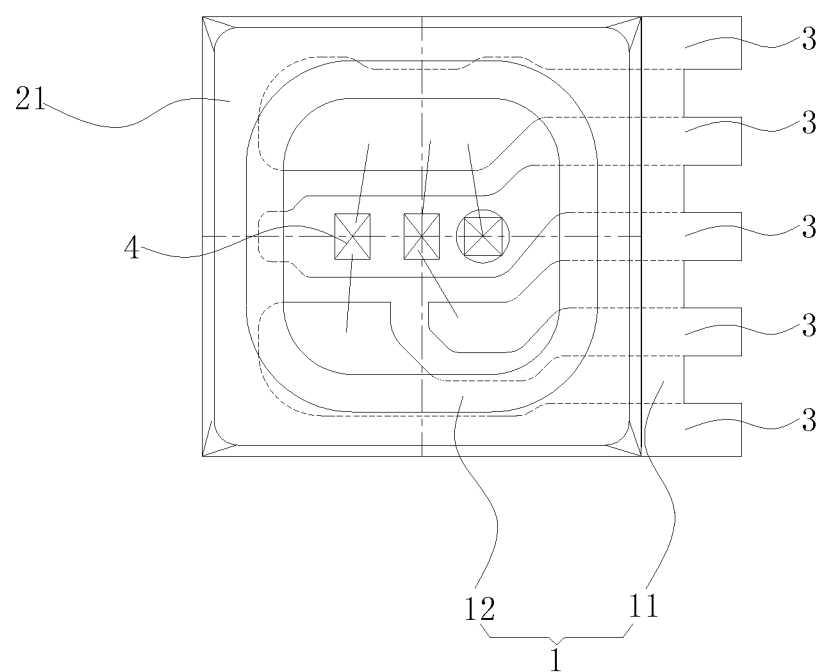
FIG. 3 is a structure diagram of an LED device described in an embodiment of the present disclosure.

The number of supports 3 is not limited to two. In other embodiments, three or more supports 3 are disposed. One metal pin 12 may be disposed between two adjacent supports 3, alternatively two or more metal pins 12 are disposed between two adjacent supports 3. As shown in FIG. 3, five supports 3 are disposed at intervals on the second lateral surface 23, and one metal pin 12 is disposed between two adjacent supports 3. Each of the five supports 3 is provided with a support surface 31 which is in a same plane with t the bottom of the cup cover 2. It should be noted that the structure of the support 3 is not limited to a triangle. The support 3 may be configured in a trapezoid or an inverted T-shape, as long as a surface supporting structure is formed.

Figure 4:
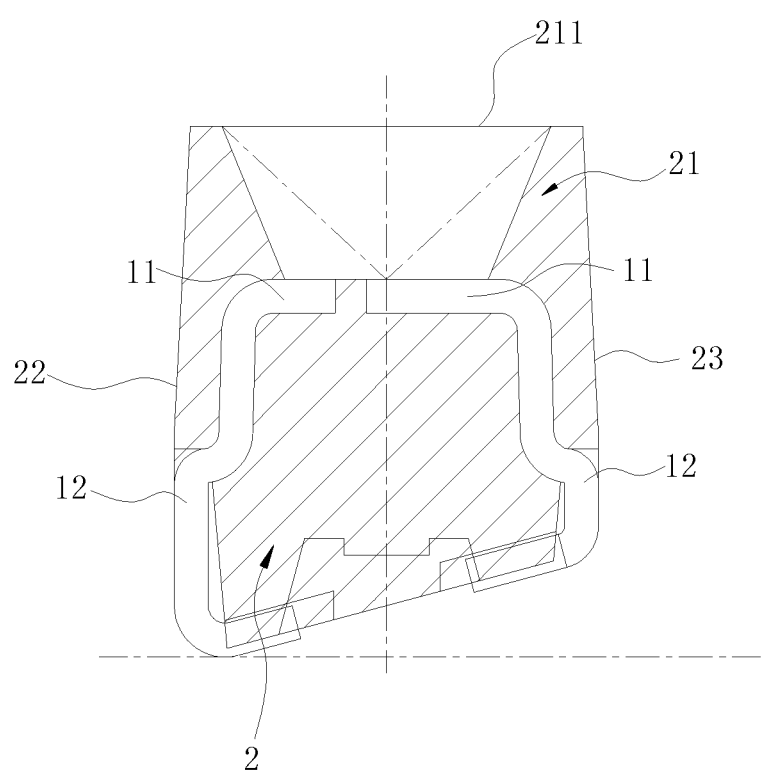
FIG. 4 is a structure diagram of an LED holder described in another embodiment of the present disclosure.
Figure 5:
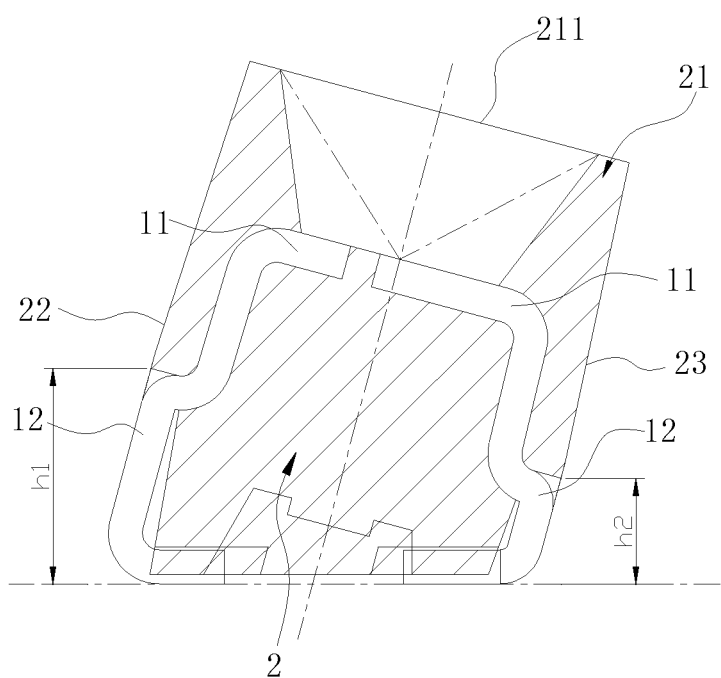
FIG. 5 is a schematic diagram illustrating an installation state of an LED holder described in another embodiment of the present disclosure.

In another embodiment of the present disclosure, as shown in FIGS. 4 and 5, the first lateral surface 22 and the second lateral surface 23 are both provided with the metal pin 12. Specifically, a first leading-out position for leading out the metal pin 12 is disposed on the first lateral surface 22. A vertical distance between the first leading-out position and the bottom of the cup cover 2 is h1. A second leading-out position for leading out the metal pin 12 is disposed on the second lateral surface 23. A vertical distance between the second leading-out position and the bottom of the cup cover 2 is h2, where h1>h2. The metal pin 12 in this embodiment also adopts the bending structure. That is, the bending heights of the metal pins 12 in the cup cover 2 are the same. Such design can reduce the manufacturing difficulty of the LED holder, have a simple and fast implementation mode and effectively improve production efficiency.

Figure 6:
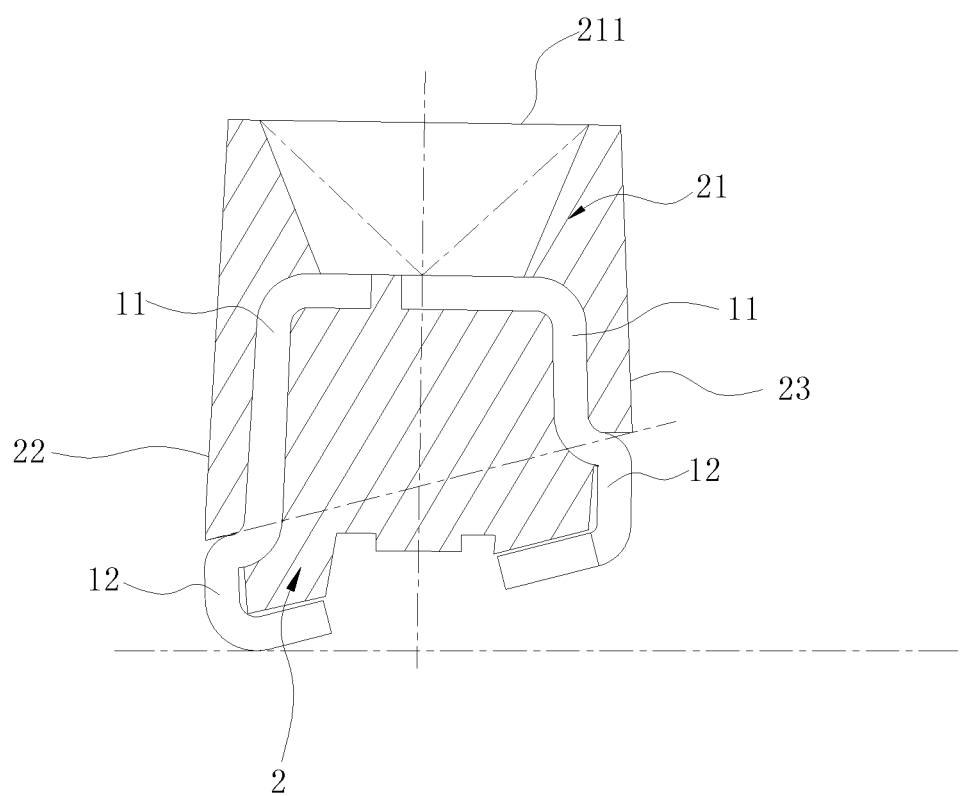
FIG. 6 is a structure diagram of an LED holder described in another embodiment of the present disclosure.
Figure 7:
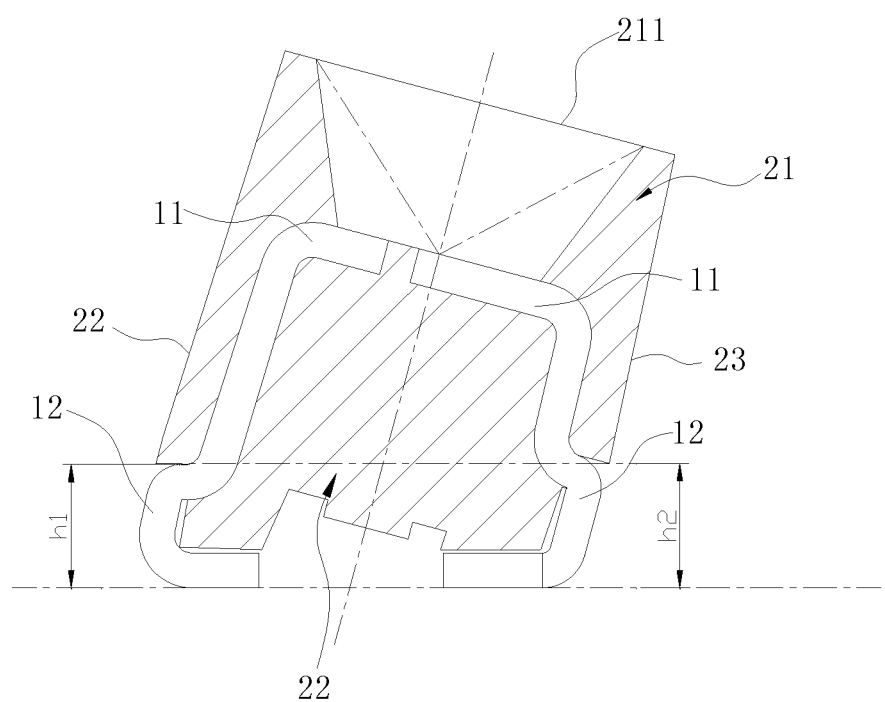
FIG. 7 is a schematic diagram illustrating an installation state of an LED holder described in another embodiment of the present disclosure.

Furthermore, as shown in FIGS. 6 and 7, the vertical distance h1 between the first leading-out position and the bottom of the cup cover may also be designed to be equal to the vertical distance h2 between the second leading-out position and the bottom of the cup cover 2. That is, the metal pins 12 are led out at a same position on the lateral surface of the cup cover 2. In this structure, the bending heights of the metal pins 12 in the cup cover 2 are different. The bending height of the metal pin 12 disposed on the first lateral surface 22 in the cup cover 2 is greater and the bending height of the metal pin 12 disposed on the second lateral surface 23 which is lower than the first lateral surface 22 is smaller, which is different from the traditional structure that the bending heights of bins are the same, so the thickness of the sealant is fundamentally reduced In other embodiments, the leading-out position of the metal pin 12 on the higher lateral surface may also be lower than the leading-out position of the metal pin 12 on the lower lateral surface. Specifically, the vertical distance h1 between the first leading-out position and the bottom of the cup cover 2 is less than the vertical distance h2 between the second leading-out position and the bottom of the cup cover 2, that is, h1<h2. Such design also different from the traditional structure. Not only the thickness of the sealant can be reduced, but also a high stability of the LED holder can be achieved while having an extremely thin sealant.

In the above embodiments, the metal pins 12 are led out from two lateral surfaces respectively, so the volume of the LED holder is reduced and more metal frames 1 may be disposed. The metal pins 12 are disposed on the first lateral surface 22 and/or the second lateral surface 23 the height of which is different from the height of the first lateral surface 22, such configuration can facilitate the installation and fixation of the LED holder, reduce the installation difficulty, increase the installation speed and enhance the stability of the LED holder after installation.

In an embodiment, the metal pins 12 exposed outside the cup cover 2 may also be six, the six metal pins 12 are distributed on the first lateral surface 22 and the second lateral surface 23. The six metal pins 12 may be evenly or unevenly distributed on two lateral surfaces. That is, the number of the metal pins 12 on the first lateral surface may be greater than that of the metal pins 12 on the second lateral surface. When the LED holder is provided with six or more metal pins 12, a common cathode and a common anode configuration is achieved after the LED holder and the LED chip are assembled, reducing the manufacturing difficulty and preventing incorrect arrangement of the anode and cathode.

In this embodiment, the metal frame 1 wrapped by the cup cover 2 is provided with six metal pins 12, three of the six metal pins 12 are disposed at intervals on of the first lateral surface 22, and three of the six metal pins 12 are disposed at intervals on the second lateral surface 23.

In other embodiments, all of the metal pins 12 are led out from the bottom of the cup cover 2. Specifically, the leading out positions of the metal pins 12 are located on the side of the cup cover 2 facing away from the cup opening 211, that is, located at the bottom of the cup cover 2. Since the metal pins 12 are directly led out from the bottom of the cup cover 2, the thickness of the sealant is greatly reduced and the material consumption of the sealant is reduced.

An LED device is further provided by an embodiment of the present disclosure. As shown in FIG. 3, the LED device includes an LED holder, an LED chip 4 and a sealant. The LED holder adopts the LED holder described in any one of the above embodiments. The LED chip 4 is fixed in a cavity of the reflective cup 21 in the LED holder, and the cavity is filled with the sealant.

The LED chip 4 is one of, or a combination of three of a chip emitting ultraviolet light, a chip emitting blue light, a chip emitting green light and a chip emitting red light. In an embodiment, the LED chip 4 is a combination of the chip emitting red light, the chip emitting green light and the chip emitting the blue light.

The sealant is epoxy resin or silica gel, which can reduce optical loss.

The LED device may be a single color device, a double color device, a full-color device or a white device. When the LED device is configured to emit white light, the LED chip 4 is the chip emitting blue light and the sealant is mixed with yellow phosphor. When the LED device is the single color device, the LED chip 4 may be any color, for example, the LED chip 4 is any one of a LED chip emitting red light, a LED chip emitting orange light, a LED chip emitting yellow light, a LED chip emitting green light or a chip emitting blue light. The color of the light emitted by the LED chip 4 is not limited to the colors in this embodiment, and the sealant is transparent. When the LED device is the double color device, the LED chip 4 is a combination of any two of the above-mentioned LED chips 4, and the sealant is the transparent. When the LED device is the full-color device, the LED chip 4 is a combination of the LED chip emitting red light, the LED chip emitting green light and the LED chip emitting blue light, and the sealant is transparent.

The LED holder is manufactured in the following ways. The LED chip 4 is fixed on a die attach pad of the LED holder. Then bonding wires are welded to the LED chip 4 and a wire pad respectively. Finally the sealant is filled, and the panel is sliced after the sealant is cured. In other embodiments, the LED 4 is assembled to the LED holder by adopting an LED flip-chip mode, and no bonding wire is disposed.

An LED display screen provided by an embodiment of the present disclosure includes multiple LED devices and a printed circuit board (PCB). The multiple LED devices are installed on the PCB. The LED device is the LED device described in any one of the above embodiments.

The bottom of the cup cover 2 of the LED holder is contact with the PCB. An optical axis of the reflective cup 21 slopes down. An incline angle of the optical axis relative to the horizontal plane is equal to the incline angle α of the bottom of the cup cover 2. The configuration in which the optical axis of the reflective cup 21 slops down can meet the standard of the perception brightness of people and increase the range of the perception brightness angle.

Reference in this specification to "one embodiment" or "an embodiment" means that specific characteristics, structures, materials or features described in connection with the embodiment are included in at least one embodiment of the disclosure. The appearances of the above terms in various places in the specification are not necessarily all referring to the same embodiment, nor are separate or alternative embodiments mutually exclusive of other embodiments. Moreover, the described specific characteristics, structures, materials or features may be combined properly in one or more embodiments or examples.

The principle of the present disclosure is described above in conjunction with embodiments. The description is merely used for explaining the principle of the present disclosure, and is not intended to explain as limitations to the protection scope of present disclosure in any means. Based on the explanations herein, other embodiments of the present disclosure obtained by those skilled in the art without creative work are within the scope of the present disclosure.

What is claimed is:

1. A Light Emitting Diode (LED) holder, comprising: a metal frame and a cup cover wrapping the metal frame,
    wherein the cup cover comprises a reflective cup, a side of the cup cover facing away from a cup opening of the reflective cup is of a sloping structure, the cup cover has a first lateral surface and a second lateral surface disposed opposite to each other, a height of the first lateral surface is greater than a height of the second lateral surface, and the metal frame comprises metal pins exposed outside the cup cover, and the metal pins are disposed on at least one of the first lateral surface and the second lateral surface;
    wherein the LED holder further comprises a support disposed on the second lateral surface for increasing installation stability of the cup cover.

2. The LED holder according to claim 1, wherein the side of the cup cover facing away from the cup opening of the reflective cup is a bottom of the cup cover, wherein the first lateral surface is provided with a first leading-out position where the metal pin is led out of the cup cover, and a vertical distance between the first leading-out position and the bottom of the cup cover is h1, wherein the second lateral surface is provided with a second leading-out position where the metal pin is led out of the cup cover, and a vertical distance between the second leading-out position and the bottom of the cup cover is h2, wherein h1≥h2.

3. The LED holder according to claim 1, wherein the side of the cup cover facing away from the cup opening of the reflective cup is a bottom of the cup cover, wherein the first lateral surface is provided with a first leading-out position where the metal pin is led out of the cup cover, and a vertical distance between the first leading-out position and the bottom of the cup cover is h1, wherein the second lateral surface is provided with a second leading-out position where the metal pin is led out of the cup cover, and a vertical distance between the second leading-out position and the bottom of the cup cover is h2, wherein h1<h2.

4. The LED holder according to claim 1, wherein the metal frame comprises four metal pins, and the four metal pins are all disposed on the second lateral surface.

5. The LED holder in claim 1, wherein the metal frame (1) comprises at least six metal pins (12), and the at least six metal pins (12) are distributed on the first lateral surface (221) and the second lateral surface (222).

6. The LED holder according to claim 1, further comprising at least two supports disposed at intervals on the second lateral surface, wherein at least one of the metal pins is disposed between adjacent two supports.

7. The LED holder in claim 1, wherein the support has a support surface, and the support surface and the side of the cup cover facing away from the cup opening are in a same plane.

8. The LED holder according to claim 7, wherein the support is a triangle support plate.

9. An LED device, comprising an LED holder, an LED chip and a sealant,
    wherein the LED holder comprises: a metal frame and a cup cover wrapping the metal frame, the cup cover comprises a reflective cup, a side of the cup cover facing away from a cup opening of the reflective cup is of a sloping structure, the cup cover has a first lateral surface and a second lateral surface disposed opposite to each other, a height of the first lateral surface is greater than a height of the second lateral surface, and the metal frame comprises metal pins exposed outside the cup cover, and the metal pins are disposed on at least one of the first lateral surface and the second lateral surface, wherein the LED holder further comprises a support disposed on the second lateral surface for increasing installation stability of the cup cover;
    wherein the LED chip is fixed in a cavity of the reflective cup in the LED holder, and the cavity is filled with the sealant.

10. An LED display screen, comprising a plurality of LED devices and a PCB, wherein the plurality of LED devices are installed on the PCB, and each of the plurality of LED devices comprises an LED holder, an LED chip and a sealant,
    wherein the LED holder comprises: a metal frame and a cup cover wrapping the metal frame, the cup cover comprises a reflective cup, a side of the cup cover facing away from a cup opening of the reflective cup is of a sloping structure, the cup cover has a first lateral surface and a second lateral surface disposed opposite to each other, a height of the first lateral surface is greater than a height of the second lateral surface, and the metal frame comprises metal pins exposed outside the cup cover, and the metal pins are disposed on at least one of the first lateral surface and the second lateral surface, wherein the LED holder further comprises a support disposed on the second lateral surface for increasing installation stability of the cup cover;
wherein the LED chip is fixed in a cavity of the reflective cup in the LED holder, and the cavity is filled with the sealant.

\* \* \* \* \*